United States Patent
Fanning et al.

(10) Patent No.: US 11,510,344 B2
(45) Date of Patent: Nov. 22, 2022

(54) COMPUTER SERVER CABINET PORTABLE LOUVER SYSTEM

(71) Applicant: TechnoGuard Inc., Sterling, VA (US)

(72) Inventors: Brian T. Fanning, Leesburg, VA (US); Alfred B. Cook, Potomac Falls, VA (US)

(73) Assignee: TECHNOGUARD INC., Sterling, VA (US)

( * ) Notice: Subject to any disclaimer, the term of this patent is extended or adjusted under 35 U.S.C. 154(b) by 0 days.

(21) Appl. No.: 17/037,196

(22) Filed: Sep. 29, 2020

(65) Prior Publication Data

US 2021/0100130 A1  Apr. 1, 2021

Related U.S. Application Data

(60) Provisional application No. 62/908,463, filed on Sep. 30, 2019.

(51) Int. Cl.
*H05K 7/20* (2006.01)
*H05K 7/14* (2006.01)

(52) U.S. Cl.
CPC ....... *H05K 7/20736* (2013.01); *H05K 7/1498* (2013.01); *H05K 7/20181* (2013.01)

(58) Field of Classification Search
CPC .......... H05K 7/20181; H05K 7/20736–20745
See application file for complete search history.

(56) References Cited

U.S. PATENT DOCUMENTS

| 4,583,454 | A | * | 4/1986 | Huang | A23B 4/052 126/21 A |
|---|---|---|---|---|---|
| 4,670,280 | A | * | 6/1987 | Huang | A23B 4/052 426/465 |
| 5,165,770 | A | | 11/1992 | Hahn | |
| 6,155,920 | A | * | 12/2000 | Pan | G06F 1/20 454/313 |
| 6,185,098 | B1 | | 2/2001 | Benavides | |
| 6,775,137 | B2 | | 8/2004 | Chu et al. | |
| 7,031,154 | B2 | | 4/2006 | Bash et al. | |
| 7,286,345 | B2 | * | 10/2007 | Casebolt | G06F 1/20 361/679.48 |
| 7,499,273 | B2 | * | 3/2009 | Casebolt | G06F 1/20 361/679.46 |
| 7,872,865 | B2 | * | 1/2011 | Matsushima | G11B 33/142 361/695 |

(Continued)

FOREIGN PATENT DOCUMENTS

| CN | 108868532 A | * | 11/2018 | |
|---|---|---|---|---|
| DE | 10038821 A1 | * | 1/2002 | ......... H05K 7/20181 |
| RU | 2 648 254 C2 | | 4/2017 | |

*Primary Examiner* — Robert J Hoffberg
(74) *Attorney, Agent, or Firm* — Birch, Stewart, Kolasch & Birch, LLP

(57) ABSTRACT

A louver assembly for removable connection to a server cabinet, the louver assembly including at least one removable louver system and each louver system including a louver frame having an opening, a plurality of louvers removably connected to the louver frame and extending across the opening of the louver frame and at least one connector for removably attaching the removable louver system to the server cabinet. The louvers may be adjustable to more efficiently move air toward an inlet of an HVAC system or from an exhaust of the HVAC system to the server cabinet.

16 Claims, 5 Drawing Sheets

(56) References Cited

U.S. PATENT DOCUMENTS

| | | | |
|---|---|---|---|
| 8,009,430 B2 * | 8/2011 | Claassen | H05K 7/20745 |
| | | | 361/724 |
| 8,154,870 B1 | 4/2012 | Czamara et al. | |
| 8,555,591 B2 * | 10/2013 | Yeh | E06B 7/082 |
| | | | 52/473 |
| 8,593,815 B2 * | 11/2013 | Claassen | H05K 7/20754 |
| | | | 361/724 |
| 8,939,824 B1 | 1/2015 | Bash et al. | |
| 8,964,375 B2 * | 2/2015 | Claassen | H05K 7/20754 |
| | | | 361/679.5 |
| 9,091,496 B2 | 7/2015 | Imwalle et al. | |
| 9,267,743 B2 * | 2/2016 | Sugimoto | F28F 9/00 |
| 9,894,807 B2 * | 2/2018 | Bard | H05K 7/20736 |
| 9,930,813 B2 * | 3/2018 | Meyer | H05K 7/20009 |
| 10,470,340 B2 * | 11/2019 | Skoglund | H05K 5/0213 |
| 10,624,241 B1 * | 4/2020 | Ross | H05K 7/20181 |
| 2009/0255653 A1 * | 10/2009 | Mills | H05K 7/20736 |
| | | | 165/104.34 |
| 2012/0079945 A1 * | 4/2012 | Roberts | B01D 46/0038 |
| | | | 454/284 |
| 2012/0145363 A1 * | 6/2012 | Peng | F28D 15/0275 |
| | | | 415/213.1 |
| 2013/0021746 A1 | 1/2013 | Campbell et al. | |
| 2014/0216683 A1 * | 8/2014 | Meyer | H05K 7/20009 |
| | | | 165/48.1 |
| 2019/0284869 A1 | 9/2019 | Dawson | |

* cited by examiner

COMPUTER SERVER CABINET PORTABLE LOUVER SYSTEM

CROSS-REFERENCE TO RELATED APPLICATIONS

This application claims priority under 35 U.S.C. § 119(e) to U.S. Provisional Application No. 62/908,463, filed Sep. 30, 2019, the disclosure of which is incorporated herein by reference.

BACKGROUND OF THE INVENTION

Field of Invention

The present invention is directed to the field of data center facility environmental controls, specifically to directing air flow from an HVAC system to a server cabinet or to directing air flow from an exhaust of a server cabinet towards a return of a facility HVAC system.

Description of the Related Art

With the fast growing data center market and massive power consumption associated with its infrastructure, the need to conserve resources is of utmost importance. It is imperative to provide efficient flow of conditioned air from an HVAC system through computer servers, for cooling purposes, and then return the conditioned air to facility HVAC systems. Energy cost associated with data center operations are massive and any increase in efficiency directly affects those costs.

It is known that data centers include a plurality of server cabinets housing servers, and that the servers generate waste heat. To facilitate the cooling of the servers, some data centers include a Cold Aisle Containment (CAC) surrounding and sealing the intake side of one or more server cabinets, in which cooled air, such as air conditioned air (air may be conditioned by an air conditioner), is introduced into the CAC through a perforated floor (or otherwise a floor having a ducting of some sort).

The cooled air from an HVAC system passes through the servers of one or more server cabinets by entering the intake side of the one or more server cabinets to an exhaust side of the one or more server cabinets to cool the servers (i.e., from inside the CAC to outside the CAC). The exhaust side of the server cabinet(s) can be connected to a Hot Aisle Containment (HAC), which is a sealed enclosure for directing the waste heat produced by the servers back into the air conditioner, which can then be re-introduced into the CAC. Due to the natural rising of the waste heat, an intake duct for cooling the waste heat may be provided above the server cabinets.

That is, the most common data center design provides cool conditioned air from below the floor to the front of the servers (i.e., the intake side). As cooled/conditioned air is pulled through the front of these servers, it is superheated and pushed out of the back side (i.e., exhaust side) for return to the facilities HVAC system to be cooled again. This relies on the rise of heat to direct airflow upwards to help return the heated air to the HVAC system from above.

As these computer servers continue to advance, they require more power and create hotter exhaust heat at a higher velocity than older servers. These factors can cause undesirable situations, such as superheated air blowing into the exhaust of other servers (e.g., other server cabinets located adjacent to an exhaust side of the server cabinet) or can cause air turbulence hampering the ability of the hot air to naturally rise and return to the HVAC system.

There is a need in the data center environment for an arrangement to efficiently direct heated airflow from the servers to the HVAC system. In addition, there is a particular need to be able to apply such an arrangement to existing server cabinets located in a data center.

SUMMARY OF THE INVENTION

The present invention is related to a louver assembly including a louver system that is easily and cost effectively installed on existing server cabinets to direct heated air from an exhaust side of the server cabinet to aid with the natural rise of heat towards an HVAC system, or to direct cooled air upwards from an HVAC system towards the server cabinet. This action also helps to reduce turbulence and/or the flow of hot air into an adjacent server.

Further scope of applicability of the invention will become apparent from the detailed description given hereinafter. However, it should be understood that the detailed description and specific examples, while indicating embodiments of the invention, are given by way of illustration only, since various changes and modifications within the scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1A:
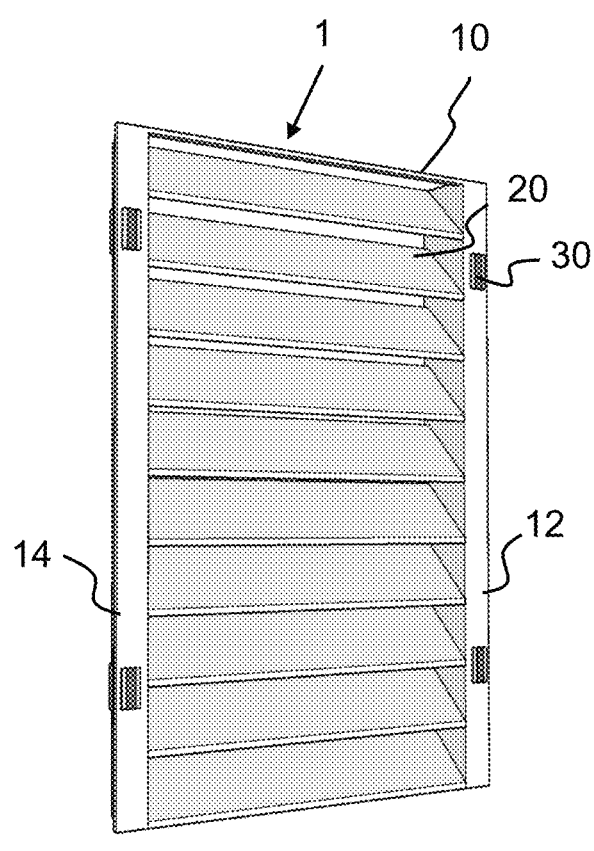
FIG. 1a is an interior perspective view of a louver system according to the present invention to be connected to an exhaust side of a server cabinet.

The present invention will now be described with reference to the accompanying drawings, wherein the same reference numerals have been used to identify the same or similar elements throughout the several views.

The present invention permits tool-less installation of the louver system onto an existing server cabinet to direct air away from the server cabinet and towards an inlet of an HVAC system. Further, the present invention permits easy deployment, removal and redeployment.

FIG. 1a illustrates a louver system 1 of the present application for connection to an exhaust side 210 of a server cabinet 200 for directing air heated by servers of the server cabinet 200 upwards toward an HVAC system. That is, each server cabinet 200 include an intake side 220, which receives cool conditioned air from an HVAC system, and the conditioned air increases in temperature as it passes through the servers of the server cabinet 200 and proceeds out of the server cabinet 200 at the exhaust side 210.

Each louver system 1 may include a louver frame 10, one or more connection members 30 for removably connecting the louver system 1 to a server cabinet 200, and one or more louvers 20. Further, each louver system 1 may further comprise a first flange 12 and a second flange 14 for housing the one or more connection members 30. The first flange 12 may extend outwardly from a first side of the louver frame 10, and the second flange 14 may extend outwardly from a second side of the louver frame 10 opposite to the first side of the louver frame 10.

A front surface (or front face or inner side) of the louver system 1 may be substantially planar (i.e., flat) to allow for the louver system 1 to abut directly against a server cabinet 200 such that the louver frame 10 extends away from the outer surface of the server cabinet 200. Alternatively, the front surface of the louver system 1 may have any shape to correspond to an exhaust side (e.g., rear face) 210 or an intake side (e.g., front face) 220 of the server cabinet 200 (see FIG. 2 and the corresponding description below).

Alternatively, the louver system 1 may be provided without the first and second flanges 12, 14, and the one or more connection member 30 may instead be attached to or embedded in any portion of the louver frame 10.

As shown in FIG. 1a, the louvers 20 of the louver system 1 are angled upward proceeding in a direction away from the inner side of the louver system 1 to be attached to the exhaust side of the server to direct air flow upward out of the server cabinet 200.

Figure 1B:
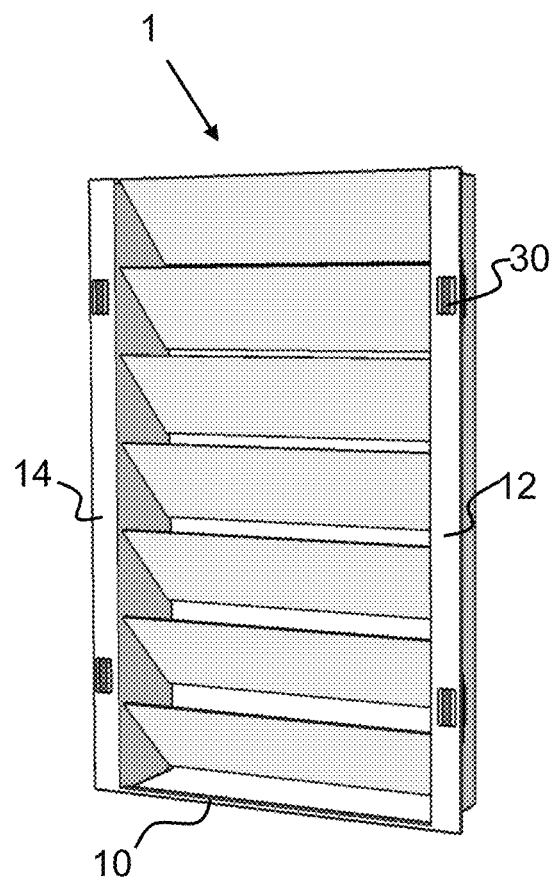
FIG. 1b is an interior perspective view of a louver system according to the present invention to be connected to an intake side of a server cabinet.

FIG. 1b illustrates the louver system 1 rotated 180° for attachment to an intake side 220 of a server cabinet 200, such that the louvers 20 of the louver system 1 are angled upward proceeding in a direction toward the inner side of the louver system 1 (i.e., towards a surface to which the server cabinet 200 is attached) to direct air flow upward into the server cabinet 200, for cooling of the servers of the server cabinet 200. Providing the louver system 1 onto an intake side 220 of a server cabinet 200 improves the air flow through the server cabinet 200, thereby more efficiently cooling the servers of the server cabinet 200.

Since the louver system 1 is removable, via the one or more connection members 30, a user may manually rotate the louver system 1 for attachment to an intake side 220 of the server cabinet 200 or to an exhaust side 210 of the server cabinet 200.

The louver system 1 of FIG. 1a is shown with ten (10) louvers 20, and the louver system 1 of FIG. 1b is shown with seven (7) louvers 20. However, any number of louvers 20 may be utilized depending on the number of stacked servers on each shelf of a server cabinet 200, the size of the server cabinet 200, desired airflow characteristics, etc. For instance, the louver system 1 of FIG. 1a may be utilized for a server cabinet 200 having two servers (e.g., server units) on each shelf (e.g., the servers may be stacked on one another), and the louver system 1 of FIG. 1b may be utilized for a server cabinet 200 having three servers on each shelf of the server cabinet 200. That is, spacing between adjacent louvers 200 may be adjusted, by removing the louvers 200 from corresponding (e.g., respective) fixing members 16, 18 (see FIG. 4) of the louver frame 10 of the louver system 1, or adding louvers 20 to corresponding fixing members 16, 18 of the louver frame 10, as discussed in detail below with respect to FIGS. 4-6, to equate to (or be substantially equal to) a height of the one or more servers on each shelf of the server cabinet 200 to improve air flow through the server cabinet 200 (e.g., air flow into or air flow exiting the server cabinet 200, depending on whether the louver system 1 is installed on the intake side or the exhaust side of the server cabinet 200).

The louver frame 10 may include the first flange 12 extending from a front surface of the louver frame 10 at a first side of the louver frame 10, and the second flange 14 extending from the front surface of the louver frame 10 at a second side of the louver frame 10 opposite to the first side.

The front surface of each louver frame 10, including the first flange 12 and the second flange 14, may abut directly against a server cabinet 200. Each louver frame 10 may include the one or more connectors 30 to removably connect the louver system 1 to the server cabinet 200. That is, each louver system 1 may be easily attached (i.e., removably attached) and removed from a respective server cabinet. More than one connector 30 may be used, and when a plurality of connectors 30 is provided in the louver frame 10, the connectors 30 may be evenly distributed along a periphery of the louver frame 10 to uniformly engage the server cabinet 200. That is, the connectors 30 may be spaced apart from one another on the louver frame 10 such that a connection force between the louver system 1 and the server cabinet 200 is evenly distributed.

Each connector 30 may be a magnet attached to or embedded in a front surface of the louver frame 10, as illustrated in FIGS. 1a and 1b. Alternatively, each connector 30 may be any type of fastener, such as a bracket, clamp, bolt, screw, and the like. When each connector 30 is a bracket, the bracket may connect the louver system 1 to a top surface and/or a bottom surface of the server cabinet 200.

Each connector 30 may be embedded in the louver frame 10. FIGS. 1a and 1b illustrate a louver system 1 with four connectors 30, with each connector 30 respectively embedded in one of the first flange 12 and the second flange 14 of the louver frame 10. Alternatively, each connector 30 may be attached to the louver frame 10, such as by adhesive bonding, brazing, welding, plastic welding, or by fastening with a fastener, including a screw, bolt and the like.

The louver frame 10 may be comprised of a thermoplastic material that has sufficient heat resistant properties to resist thermal degradation due to heated air from the server cabinets 200.

The louver frame 10 may be formed by any type of molding (e.g., injection molding, blow molding, compression molding, rotational molding, etc.), 3D printing, deposition (such as laser deposition or fused deposition modeling), or any other known process. Further, the louver frame 10 may be molded around each of the one or more connectors 30 to embed each connector 30 to the louver frame 10. The injection molding of the louver frame 10 with each connector 30 reduces production time and provides an improved connection between the louver frame 10 and each connector 30.

That is, the louver frame 10 may be a one-piece molded plastic that is molded around the one or more connectors 30, such that the one or more connectors 30 are embedded in the louver frame 10.

Each connector 30 may be designed to be flush against a front surface of the louver frame 10 to directly engage the server cabinet 10. Further, the one or more connectors 30 may be a magnet aligned with a metal frame of the server cabinet 200 to attach the louver frame 10 to the metal frame of the server cabinet 200 via a magnetic attraction force.

Each louver frame 10 may be comprised of plastic, metal, ceramic or a composite material, such as carbon fiber, fiberglass, a resin, etc. Further, the louver frame 10 may be sized to align with servers installed in the server cabinet 200. That is, louver systems 1 according to the present invention may be designed for industry standard sizes. Alternatively, louver systems according to the present invention may be designed to meet future requirements.

Spacing between the louvers 20 may be adjusted to optimize and improve air flow through the louver system 1, depending on the desired application. For instance, louvers 20 can be removed (manually) from the louver frame 10 (see FIGS. 4-6), to increase the spacing between adjacent louvers 20, or one or more louvers 20 may be added to the louver frame 10 to decrease spacing between adjacent louvers 20. Further, each louver 20 may be provided at any angle with respect to a front surface of the server cabinet 200 to which the louver system 1 is installed, so as to have maximum efficiency.

Figure 2:
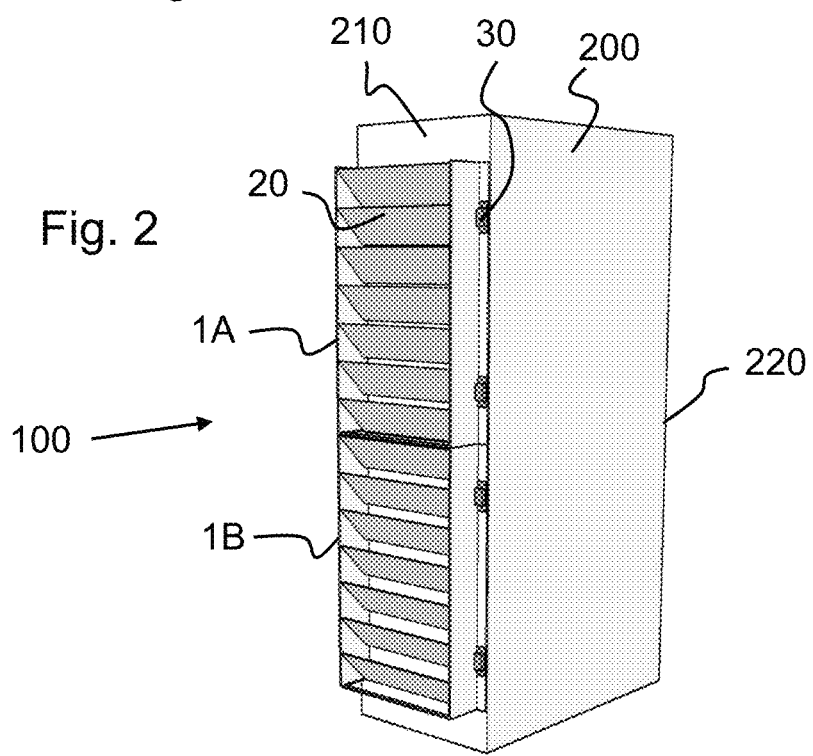
FIG. 2 is a perspective view of a louver assembly according to the present invention including two louver systems attached to an exhaust side of a server cabinet.

FIG. 2 illustrates two louver systems 1A, 1B of the present application attached to an exhaust side 210 of a server cabinet 200, with a first louver system 1A located vertically above a second louver system 1B. The louver systems 1A, 1B need not be directly connected to one another, but can simply abut against one another, or be spaced from one another. Further, top and bottom surface of each louver system may be substantially flat (e.g., planar) to as to abut against another louver system. That is, a top surface of a first louver system 1 may abut against a bottom surface of a second louver system 1 and a top surface of the second louver system 1 may abut against a bottom surface of a third louver system 1, and any number of louver systems 1 may abut against one another when installed on a server cabinet. Alternatively, if multiple louver systems 1A, 1B are attached to a single server cabinet, the louver systems 1A, 1B may be attached to one another, such as by using connectors 30, which may be in the form of magnets or in the form of a male connection member 30 on one of the first or second louver systems 1A, 1B and a female connection member 30 on another one of the first or second louver systems 1A, 1B, where the male connection member 30 fits into, and has a shape corresponding to, the female connection member 30. A single unit/louver system 1 or more than two louver systems 1A, 1B may also be used.

As is shown in FIG. 2, the louver system(s) 1 may encompass (i.e., overlap or be positioned on) less than an entire height and less than an entire width of the server cabinet 200. That is, the louver system(s) 1 may cover less than an entire cross-section of the server cabinet 200, and may only cover portions of the server cabinet 200 that are exposed to airflow (e.g., openings of the server cabinet 200), or may cover more of less than the portions of the server cabinet 200 that are exposed to airflow.

Figure 3:
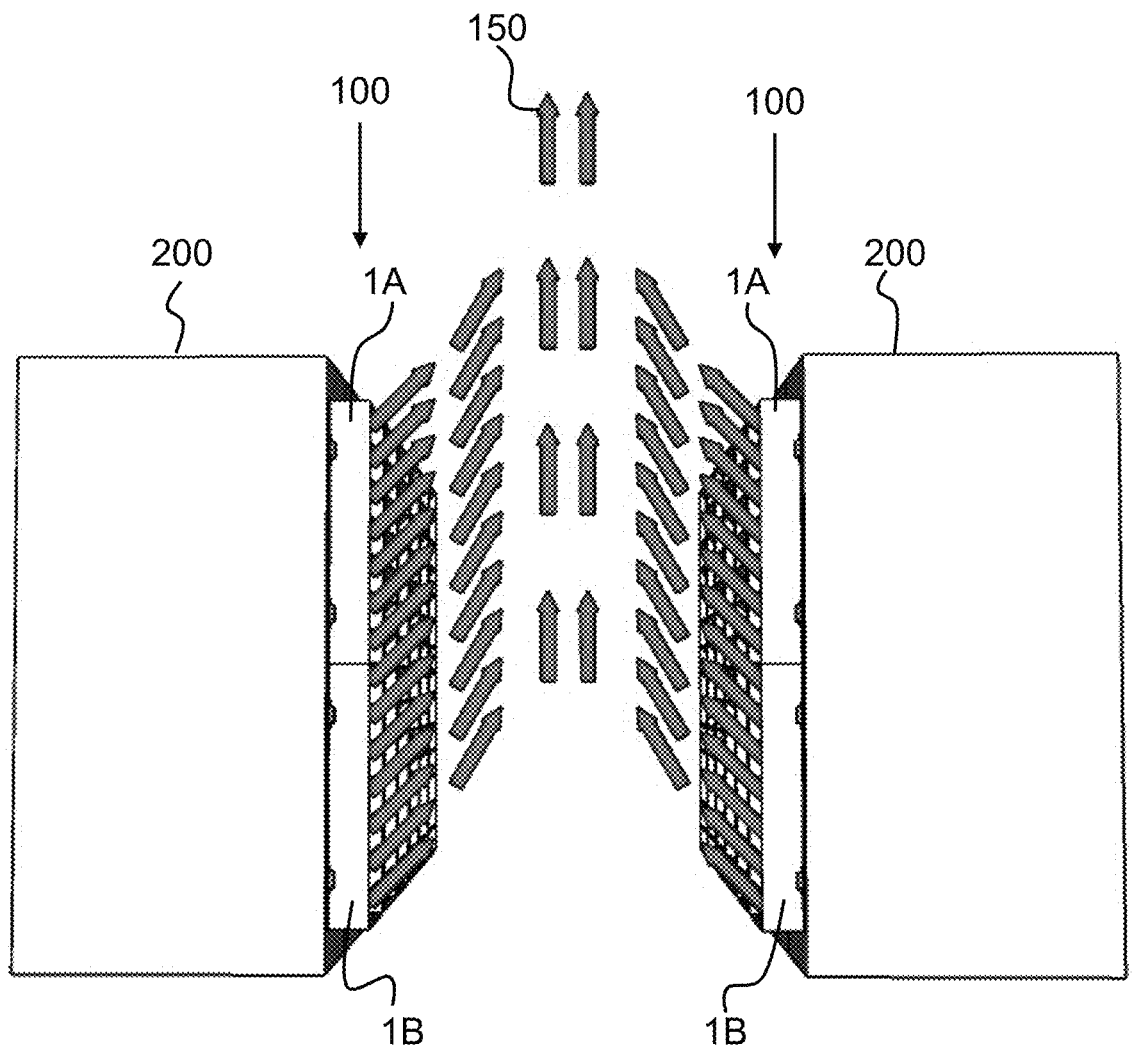
FIG. 3 is a view of a louver assembly according to the present application including a plurality of louver systems connected to multiple server cabinets to direct heated air upward.

FIG. 3 is a view of a louver assembly 100 according to the present application including a plurality of louver systems 1A, 1B connected to multiple server cabinets 200 to direct heated air upward.

FIG. 3 illustrates multiple server cabinets 200, each server cabinet 200 being connected to two louver systems 1A, 1B that are vertically stacked and connected to an exhaust side 210 of the server cabinet 200. However, more or less louver systems 1 may be installed on (i.e., removably attached to) each server cabinet 200, depending on the size of each louver system 1, the size of the server cabinet 200, desired air flow characteristics, etc.

The louver systems 1A, 1B direct heated air, as shown by the arrows 150 that provide an indication of air flow, upward for intake by an HVAC system. The HVAC system cools and recirculates the air back to the server cabinets 200. By directing heated air away from opposing server cabinets, the louver system(s) of the present invention reduce turbulence and improve the flow of heated air towards the HVAC system, thereby improving cooling of the servers within the server cabinets 200.

Figure 4:
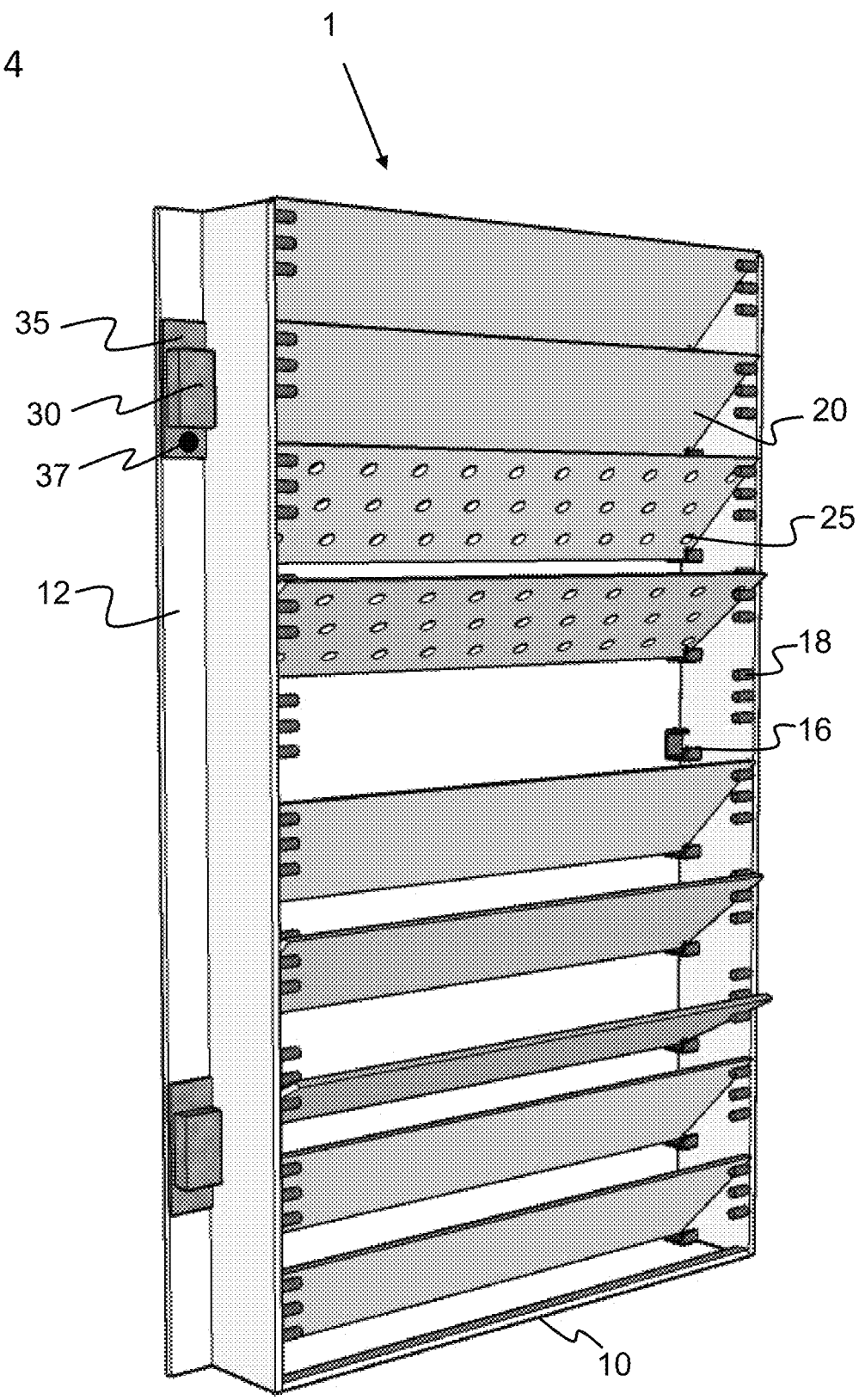
FIG. 4 is a perspective view of an outer side of louver system according to the present invention having different types of louvers.

FIG. 4 is a perspective view of a rear (outer) side of the louver system 1 according to the present invention having different types of louvers 20. For instance, each louver system 1 of the present invention may include solid louvers 20 that are provided without apertures, and baffled louvers 20 that are provided with a plurality of holes 25.

The baffled louvers 20 may include holes 25 evenly spaced throughout a cross-section of the louver 20, and may include any number of holes 25, to allow for improved air flow across the louver system 1. Alternatively, the baffled louvers 20 may have randomly spaced holes 25. Further, the holes 25 may have any shape, including a circular, oval, triangular, quadrilateral, pentagon (or any number of sides), etc.

Each louver frame 10 may include a front surface and a rear surface opposite to the front surface. The front surface of each louver frame 10 may be designed to (e.g., configured to) abut directly against the server cabinet 200. Further, each louver frame 10 includes a plurality of fixing members 16, 18 for removably attaching each respective louver 20 to the louver frame 10.

As illustrated in FIG. 4, each louver 20 may slide into the louver frame 10 via the plurality of fixing members 16, 18 provided in an opening of the louver frame 10. The fixing members 16, 18 may extend inward towards a center of the louver frame 10 and may be provided on opposing sides of the louver frame 10. Further, the fixing members 16, 18 may be provided at corresponding heights to engage opposing sides of a respective louver 20. That is, the louver frame 10 may include first fixing members 16 provided at opposing sides of a front (interior) portion of the louver frame 10 and second fixing members 18 provided at opposite sides of a rear (exterior) portion of the louver frame 10.

Further, the first fixing members 16 are provided in pairs, each pair of first fixing members 16 are provided at a same height and each pair engages opposing sides of the respective louver 20, as shown in FIG. 4.

Likewise, the second fixing members 18 are provided in pairs, each pair of second fixing members 18 are provided at a same height and each pair engages opposing sides of the respective louver 20, as shown in FIG. 4.

The plurality of fixing members 16, 18 of each louver frame 10 may include a plurality of first fixing members 16 adjacent to the front surface of the respective louver frame 10, each first fixing member 16 for attaching (e.g., fix) a front surface of a respective louver 20 to the respective louver frame 10, and a plurality of second fixing members 18 adjacent to a rear surface of the respective louver frame 10, the plurality of second fixing members 18 for attaching (e.g., fix or holding) a rear surface of the respective louver 20 to the respective louver frame 10.

Each first fixing member 16 may be comprised of a bracket that holds the respective louver 20 and restricts movement of the louver 20 in multiple directions. FIG. 4 illustrates the first fixing members 16 as a bracket having a substantially U-shape that encompasses a top surface, a bottom surface, and an edge surface of the respective louver 20. Alternatively, each first fixing member 16 may have any shape, including a semi-circular shape, for holding (e.g., fixing) the respective louver 20 into position.

Further, each second fixing member 18 may be comprised of an extension (i.e., a member extending from the louver frame 10), such as a cylindrical extension as shown in FIG. 4 or an extension having any shape. Each louver frame 10 may include multiple second fixing members 18 for each louver 20 to permit a change in an angle of each louver 20 relative to a horizontal plane of the louver system 1. As shown in FIG. 4, three second fixing members 18 may be grouped for each louver 20, allowing the angle of a corresponding louver 20 to be altered. Each louver 20, upon being installed, may abut against a top of one of the second fixing members 18 due to the gravitational force, which, together to the holding force of the corresponding first fixing member 16, attaches the louver 20 to the louver frame 10 with sufficient force to resist detachment from the exhaust air of the server cabinet 200 or the intake air of the HVAC system entering the server cabinet 200. However, the louver frame 10 may have any number of second fixing members 18 for each louver 20 to permit a greater adjustment of the angle of each louver 20. For instance, the louver frame 10 may include a single second fixing member 18, two second fixing members 18, or more than three second fixing members 18, for each louver 20.

The location of each second fixing member 18 may be predetermined to provide various angles of the louver 20 relative to the horizontal plane (of the louver system 1). For instance, the louvers 20 may be installed at an angle of 45°, 30°, 15°, or any angle between 90° and 0°.

To install a louver 20, a user slides the louver 20 into a desired one of the second fixing members 18, depending on the desired angle, and into a corresponding pair first fixing members 16. Each louver 20 is likewise removable simply by pulling out the louver 20, and louvers 20 may be removed from the louver system 1, as shown in FIG. 4, to adjust airflow, depending on the needs of a particular application.

Further, as shown in FIG. 4, each louver system 1 may include louvers 20 having different installed angles. The bottommost louver 20 in FIG. 4 abuts against a topmost second fixing member 18 among a respective group of second fixing members 18 for that louver 20, and the third louver 20 from the bottom abuts against a bottommost second fixing member 18 among a respective group of second fixing members 18.

The one or more connectors 30 may include a connector frame 35 that is attached to the louver frame 10 by a fastener 37, as shown in FIG. 4. The connector frame 35 may be comprised of a plastic, thermoplastic, metallic, or composite material. Further, the connector 30 may include a magnet or a fastener (as described above) attached (e.g., glued, welded, brazed, etc.) to the connector frame 35.

Instead of first and second fixing members 16, 18, the louver frame 10 according to the present invention may include slots for receiving and fixing each louver 20 to the louver frame 10. The slots may extend from a rear surface of the louver frame 10 to a position proximate to the front surface of the louver frame 10, and the slots may have a height equal to or substantially equal to a thickness of the louvers 20. If the slots have a height equal to the thickness of the louvers 20, the louvers 20 may frictionally engage the louver frame 10. Depending on the desired characteristics of the louver system 1, the slots may be formed with any predetermined angle.

Figure 5:
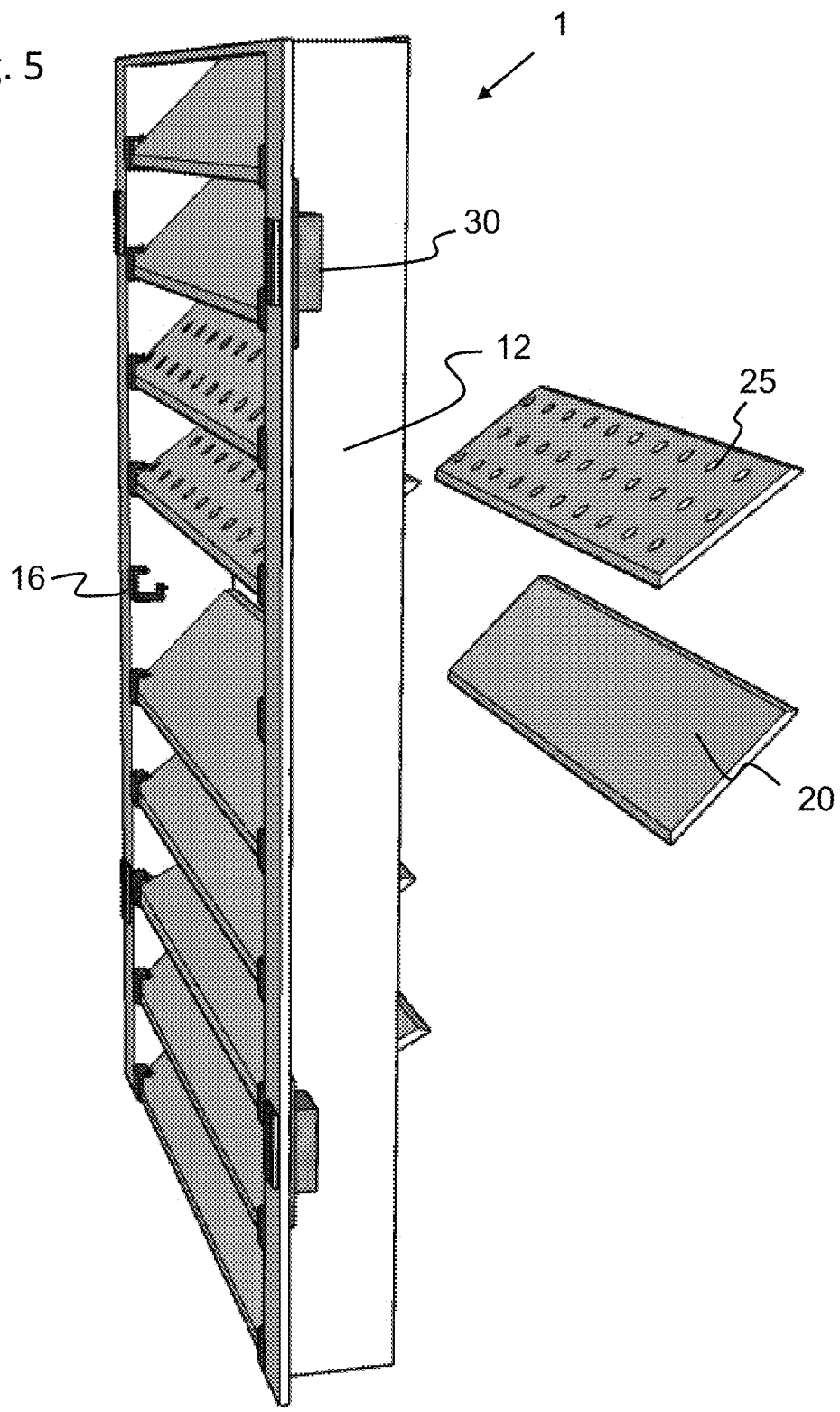
FIG. 5 is a perspective view showing louvers of a louver system during an installation process according to the present invention.

FIG. 5 is a perspective view showing louvers 20 of a louver system 1 during an installation process according to the present invention. The louver system 1 according to FIG. 5 includes different types of louvers 20, including baffled louvers 20 having holes 25 and solid louvers 20. Further, one baffled louver 20 and one solid louver 20 is shown separated from the louver system 1 to illustrate how these louvers 20 will be installed. That is, the separated louvers 20 are first positioned by a user to a desired angle corresponding to an angle of the fixing members 16, 18 of the louver frame 10, and are then inserted into the louver frame 10.

Figure 6:
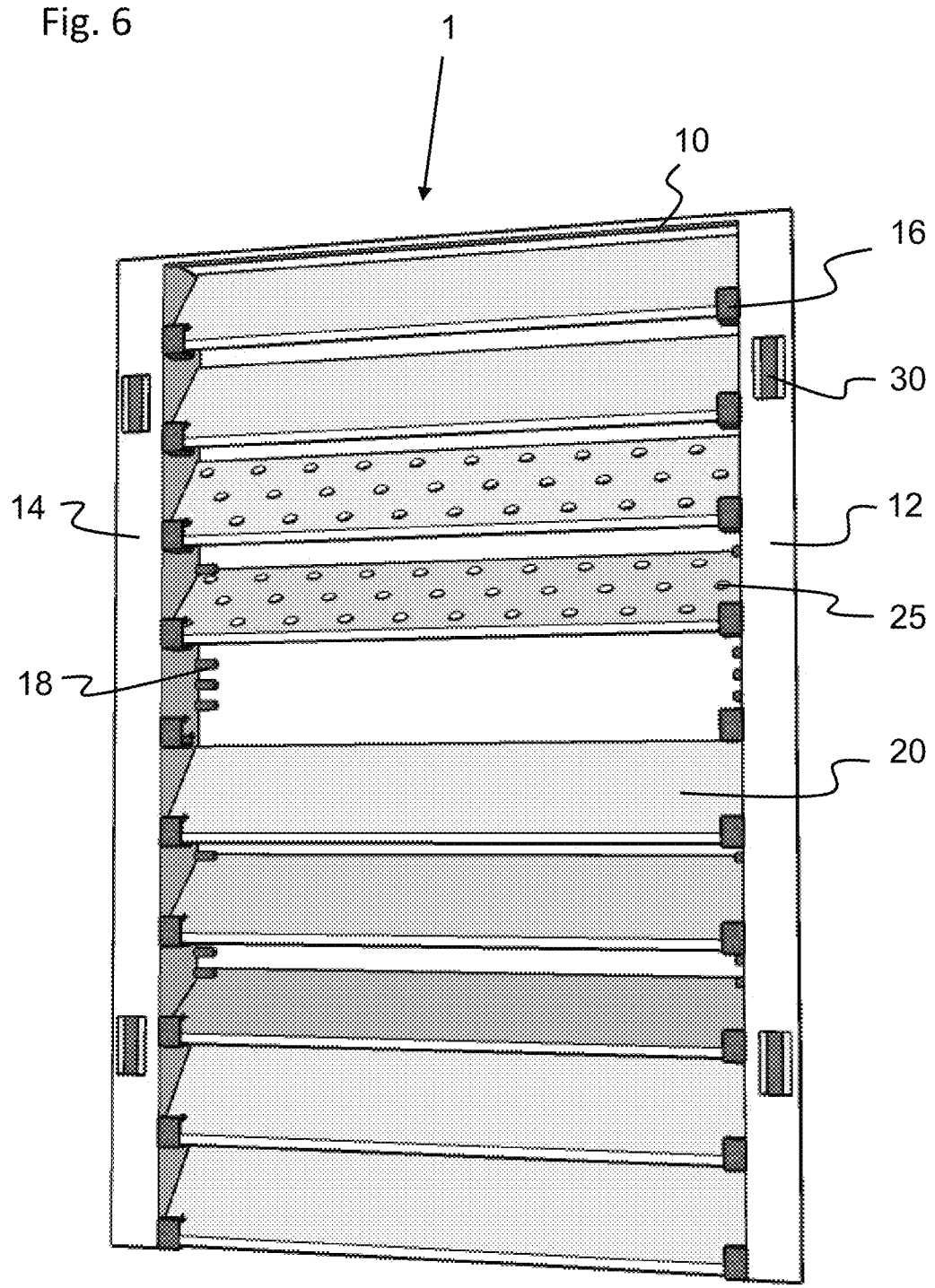
FIG. 6 is a perspective view of an inner side of the louver system according to the present invention having a plurality of connectors.

FIG. 6 is a perspective view of a front side of the louver system 1 according to the present invention having a plurality of connectors 30 provided at a first flange 12 and a second flange 14 of the louver frame 10. FIG. 6 illustrates a louver system 1 having different types of louvers 20, including baffled louvers 20 and solid louvers 20, and one louver 20 removed. As described above, the louver system 1 includes a plurality of first fixing members 16 and a plurality of second fixing members 18. Further, the connectors 30 may be embedded in a respective one of the first flange 12 and the second flange 14 of the louver frame 10, or alternatively may be attached to a respective one of the first flange 12 and the second flange 14 of the louver frame 10, or may be attached directly to the louver frame 10.

Louvers may be adjustable (manually, mechanically or electrically) to meet a user's needs. For example, the louvers may be adjustable as known in the art. Each of the louvers may be connected to one another by an adjustment rod such as the rod 140 illustrated in US 2019/0284869, herein "Dawson," which is incorporated by reference in its entirety. Further, each of the louvers may include a pin extending along its length and attached to a frame of the louver, such as shown in Dawson (see 140 shown in FIG. 3 of Dawson). The pins allow the louvers to be rotatable with respect to the frame.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A louver assembly for connection to a server cabinet, the louver assembly comprising at least one removable louver system, each of the at least one removable louver system comprising:
   a respective louver frame including:
      a front surface configured to abut directly against the server cabinet;
      a rear surface opposite to the front surface;
      an opening; and
      a plurality of fixing members provided on opposing sides of the louver frame, each of the plurality of fixing members extending inwards towards a center of the louver frame, the plurality of fixing members include:
         a plurality of first fixing members adjacent to the front surface of the louver frame; and
         a plurality of second fixing members adjacent to the rear surface of the louver frame and spaced from the plurality of first fixing members, each of the plurality of second fixing members are in the form of an extension;

a plurality of louvers removably connected to the louver frame via the plurality of fixing members and extending across the opening of the louver frame; and at least one connector for removably attaching each of the at least one removable louver system to the server cabinet, wherein each of the first fixing members is configured to fix a first side of a respective one of the louvers to the respective louver frame, wherein each of the plurality of second fixing members is configured to fix a second side of the respective one of the louvers to the respective louver frame, the second side being opposite to the first side, and wherein each of the plurality of louvers is configured to slide into the respective louver frame through the rear surface of the respective louver frame to engage an interior surface of each of a respective pair of the first fixing members and to engage a top surface of each of a respective pair of the second fixing members.

2. The louver assembly according to claim 1, wherein the at least one connector of each of the at least one removable louver system includes a plurality of connectors, wherein each of the connectors includes a magnet attached to or embedded in the front surface of the respective louver frame, and wherein the front surface of each louver frame is configured to abut directly against the server cabinet to direct air flow into or away from the server cabinet.

3. The louver assembly according to claim 1, wherein the respective louver frame includes:

a first flange extending in a first direction at the front surface of the louver frame; and a second flange extending in a second direction opposite the first direction at the front surface of the louver frame, the second flange being spaced apart from the first flange.

4. The louver assembly according to claim 1, wherein each of the plurality of louvers are oriented at a non-zero predetermined angle relative to a horizontal plane of the at least one removable louver system.

5. The louver assembly according to claim 1, wherein each of the first fixing members has a shape that encompasses a top surface, a bottom surface, and an edge surface of the respective one of the louvers.

6. The louver assembly according to claim 1, wherein the respective louver frame is comprised of a one-piece molded material and each of the at least one connector is embedded into the respective one of the louver frame.

7. The louver assembly according to claim 1, wherein at least one of the louvers of each of the at least one removable louver system includes baffles in the form of openings for enhancing air flow through a corresponding one of the at least one removable louver system.

8. The louver assembly according to claim 1, wherein the at least one removable louver system includes a plurality of removable louver systems, wherein a top surface of each of the removable louver systems is configured to abut against a bottom surface of another louver system among the plurality of removable louver systems, and wherein a bottom surface of each of the removable louver systems is configured to abut against a top surface of a second another removable louver system among the plurality of removable louver systems.

9. The louver assembly according to claim 1, wherein each of the at least one removable louver system is configured to be removably attached to either an exhaust side of a cabinet frame of the server cabinet for directing air flow away from the server cabinet or an intake side of the cabinet frame for directing air flow into the server cabinet.

10. A louver assembly for connection to a server cabinet, the louver assembly comprising at least one removable louver system, each of the at least one removable louver system comprising:

a louver frame including:
an opening;
a front surface configured to abut directly against the server cabinet; and
a rear surface opposite to the front surface;

a plurality of louvers removably connected to the louver frame, each of the plurality of louvers extending across the opening of the louver frame; and at least one connector for removably attaching each of the at least one removable louver system to the server cabinet, wherein the louver frame of each of the at least one removable louver system includes a plurality of fixing members for removably attaching each of the louvers to the louver frame, the plurality of fixing members of the louver frame including:

a plurality of first fixing members adjacent to the front surface of the louver frame, each of the first fixing members being configured to fix a first side of a respective one of the louvers to the louver frame; and a plurality of second fixing members adjacent to the rear surface of the louver frame, each of the plurality of second fixing members being configured to fix a second side of the respective one of the louvers, the second side being opposite to the first side, the plurality of second fixing members being provided in groups for each of the louvers for adjusting an angle of each of the respective one of the louvers, and wherein the angle of each of the respective one of the louvers is adjustable by sliding the respective one of the louvers onto different ones of respective opposing groups of second fixing members.

11. A louver assembly for connection to a server cabinet, the louver assembly comprising at least one removable louver system, each of the at least one removable louver system comprising:

a louver frame including:
an opening;
a front surface configured to contact the server cabinet;
a rear surface opposite to the front surface;
a plurality of first fixing members adjacent to the front surface of the louver frame;
a plurality of second fixing members adjacent to the rear surface of the louver frame, each of the plurality of second fixing members extending from the opening of the louver frame toward a center of the louver frame; and at least one connector for removably attaching the at least one removable louver system to the server cabinet; and a plurality of louvers attached to the louver frame, each of the louvers being configured to slide into and out of the louver frame by at least one of the plurality of first fixing members and by at least one of the plurality of second fixing members.

12. The louver assembly according to claim 11, wherein the at least one connector of each of the at least one removable louver system includes a plurality of connectors, wherein each of the connectors includes a magnet attached to or embedded in the front surface of the louver frame of the at least one removable louver system, and wherein the front surface of the louver frame of the at least one removable louver system is configured to abut directly against the server cabinet to direct air flow away from or to the server cabinet.

13. The louver assembly according to claim 11, wherein the at least one removable louver system includes a plurality of louver systems configured to abut one another, and wherein the plurality of louver systems is configured to be removably attached to either an exhaust side of a cabinet frame of the server cabinet for directing air flow away from the server cabinet or an intake side of the cabinet frame for directing air flow into the server cabinet.

14. The louver assembly according to claim 11, wherein the plurality of second fixing members are provided in groups for each of the louvers for adjusting an angle of a respective one of the louvers.

15. The louver assembly according to claim 11, wherein at least one of the louvers of each of the at least one removable louver system includes baffles in the form of openings for enhancing air flow through a corresponding one of the at least one removable louver system.

16. The louver assembly according to claim 11, wherein each of the first fixing members has a shape that encompasses a top surface, a bottom surface, and an edge surface of a respective one of the louvers.

* * * * *